(12) United States Patent
Katz et al.

(10) Patent No.: US 12,014,941 B2
(45) Date of Patent: Jun. 18, 2024

(54) METHOD FOR TRANSFERRING MISSING SEMICONDUCTOR CHIPS USING AN ADHESIVE STAMP

(71) Applicant: OSRAM Opto Semiconductors GmbH, Regensburg (DE)

(72) Inventors: Simeon Katz, Regensburg (DE); Andreas Weimar, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 618 days.

(21) Appl. No.: 17/284,280

(22) PCT Filed: Oct. 4, 2019

(86) PCT No.: PCT/EP2019/076912
§ 371 (c)(1),
(2) Date: Apr. 9, 2021

(87) PCT Pub. No.: WO2020/078740
PCT Pub. Date: Apr. 23, 2020

(65) Prior Publication Data
US 2021/0384051 A1    Dec. 9, 2021

(30) Foreign Application Priority Data
Oct. 18, 2018   (DE) .................. 10 2018 125 903.4

(51) Int. Cl.
*H01L 21/67*    (2006.01)
*B65G 47/90*    (2006.01)
(Continued)

(52) U.S. Cl.
CPC ........ *H01L 21/67132* (2013.01); *B65G 47/90* (2013.01); *H01L 21/67144* (2013.01);
(Continued)

(58) Field of Classification Search
CPC ......... B65G 47/90; H01L 24/97; H01L 24/98; H01L 21/67144; H01L 21/6833; H01L 21/67132; H01L 21/6835
See application file for complete search history.

(56) References Cited

U.S. PATENT DOCUMENTS 6,691,400 B1    2/2004 Negishi et al.
8,276,265 B2    10/2012 Tanaka et al.
(Continued)

FOREIGN PATENT DOCUMENTS

CN    108389825 A    8/2018
DE    69606963 T2    7/2000
(Continued)

Primary Examiner — Alonzo Chambliss
(74) Attorney, Agent, or Firm — Slater Matsil, LLP

(57) ABSTRACT

In an embodiment, an adhesive stamp includes a plurality of variable-length stamp bodies arranged in an array, wherein each stamp body has an adhesive surface on a head portion of the stamp body, the adhesive surface configured to hold a semiconductor chip, wherein a first electrode is arranged in the head portion, wherein the first electrode is chargeable and whose polarity is changeable, wherein a second electrode is arranged in a foot portion of the stamp body, wherein the second electrode is chargeable and whose polarity is changeable, wherein a length of the stamp body is variable depending on charges applied to the first electrode and the second electrode, and wherein the adhesive stamp is configured to transfer semiconductor chips.

13 Claims, 2 Drawing Sheets

(51) Int. Cl.
*H01L 21/683* (2006.01)
*H01L 23/00* (2006.01)

(52) U.S. Cl.
CPC ...... *H01L 21/6833* (2013.01); *H01L 21/6835* (2013.01); *H01L 24/97* (2013.01); *H01L 24/98* (2013.01)

(56) References Cited

U.S. PATENT DOCUMENTS

| | | |
|---|---|---|
| 2012/0313241 A1* | 12/2012 | Bower .................... H01L 24/13 257/737 |
| 2014/0241843 A1 | 8/2014 | Golda et al. |
| 2017/0133257 A1 | 5/2017 | Wu et al. |
| 2017/0140961 A1 | 5/2017 | Sasaki et al. |
| 2017/0278760 A1 | 9/2017 | Chen et al. |
| 2017/0345692 A1 | 11/2017 | Liu et al. |
| 2019/0148348 A1* | 5/2019 | Brodoceanu ............ G03F 7/162 438/23 |
| 2019/0244846 A1 | 8/2019 | Hsieh et al. |
| 2019/0252350 A1 | 8/2019 | Schwarz et al. |

FOREIGN PATENT DOCUMENTS

| | | |
|---|---|---|
| DE | 112009002391 T5 | 1/2012 |
| DE | 102016221281 A1 | 5/2018 |
| JP | 2006156550 A | 6/2006 |

* cited by examiner

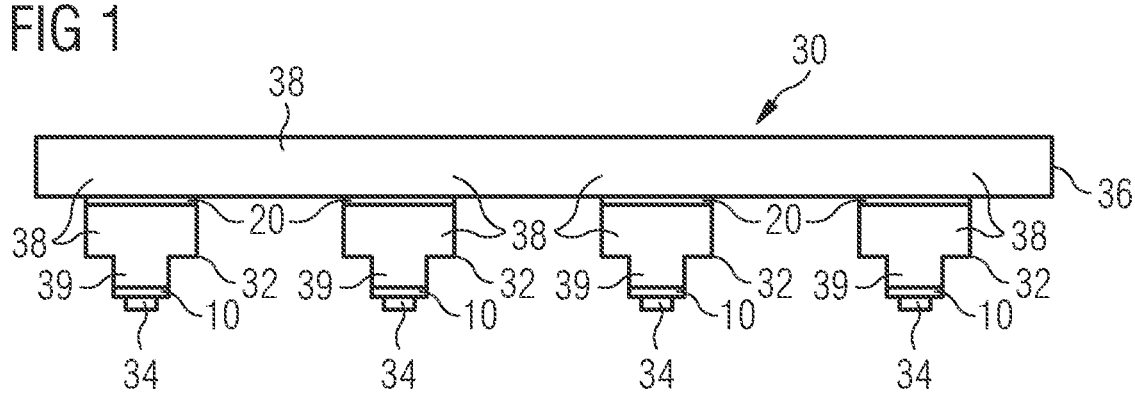
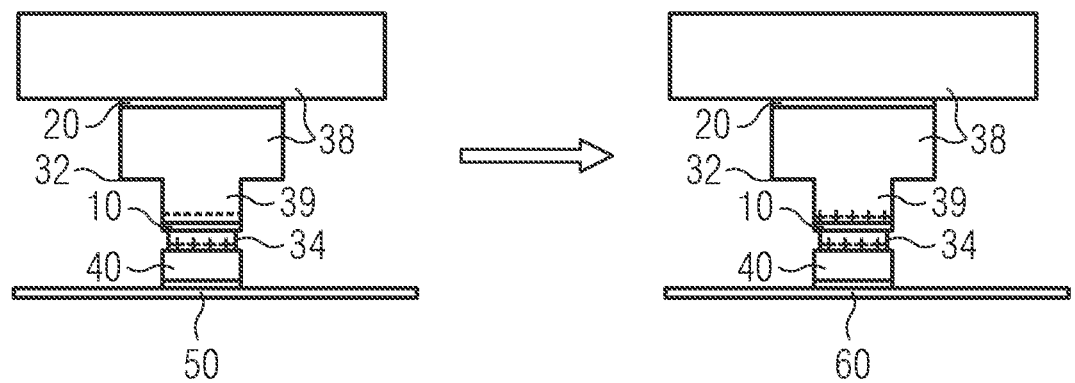
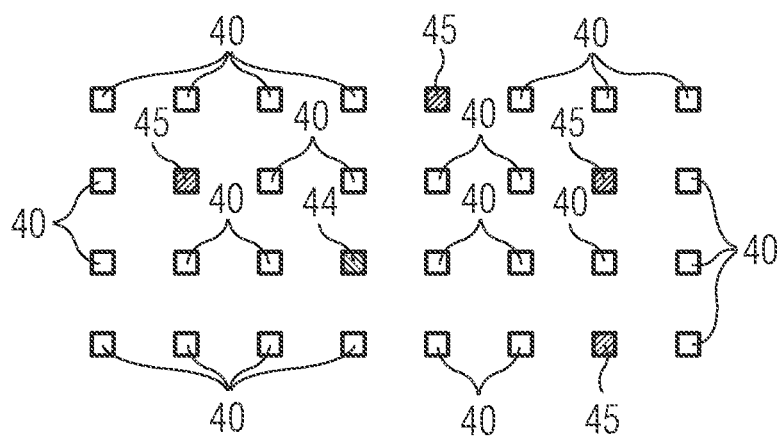

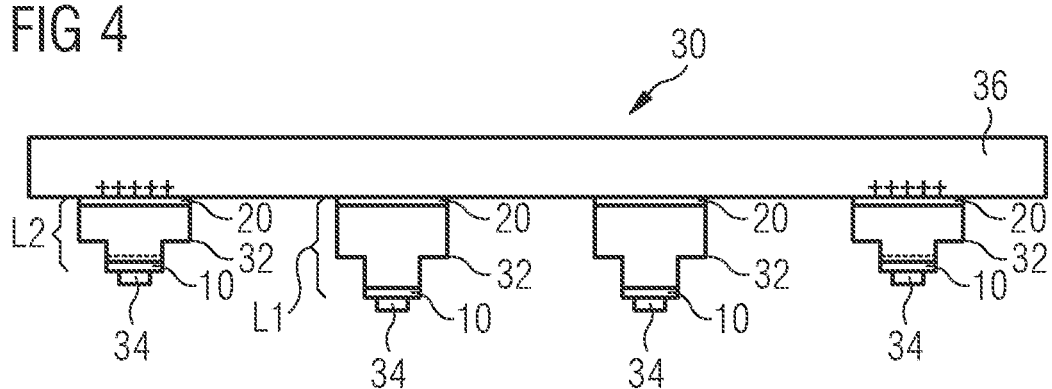
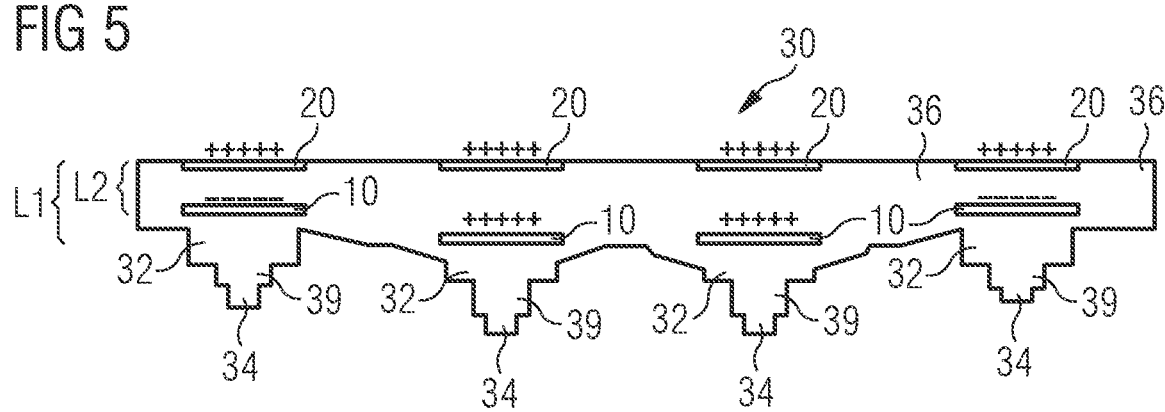
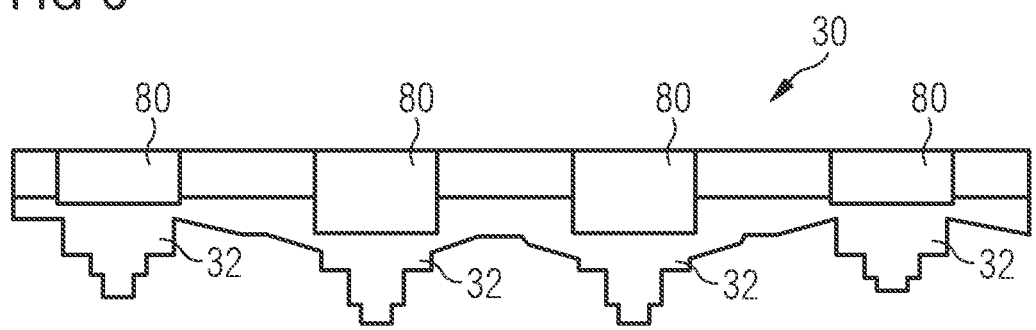

METHOD FOR TRANSFERRING MISSING SEMICONDUCTOR CHIPS USING AN ADHESIVE STAMP

This patent application is a national phase filing under section 371 of PCT/EP2019/076912, filed Oct. 4, 2019, which claims the priority of German patent application 102018125903.4, filed Oct. 18, 2018, each of which is incorporated herein by reference in its entirety.

TECHNICAL FIELD

Disclosed is an adhesive stamp. Disclosed is further a method for transferring missing semiconductor chips of semiconductor chips to be arranged on a carrier in a predetermined pattern.

BACKGROUND

An adhesive stamp enables the simultaneous transfer of a plurality of semiconductor chips from a source carrier to a target carrier. In this way, a plurality of components can be manufactured in a composite in which the target carrier with the semiconductor chips mounted thereon has been singulated in a later manufacturing step. The semiconductor chips can be LEDs, for example, especially small-size LEDs—so-called µLEDs. Simultaneous transfer of semiconductor chips is also suitable for components with a plurality of semiconductor chips mounted thereon, such as displays with a large number of LEDs. The described simultaneous transfer is also called parallel transfer.

The parallel transfer of a plurality of semiconductor chips onto a carrier substrate is cost-effective and time-saving. It is desirable that the parallel pickup of semiconductor chips from the source substrate and placement on the target substrate is carried out in a controlled and reliable manner. However, even with a 99.9% successful transfer of µLEDs to a target substrate for a display, thousands of µLEDs are still defective and require a selective repair mechanism to replace or supplement the defective and possibly missing µLEDs.

A conventional parallel transfer of semiconductor chips by means of a polymer adhesive stamp makes it possible on the one hand to compensate for smaller particles and surface roughness and thus allows the semiconductor chips to be picked up relatively reliably. During pickup, adhesion takes place by means of Van der Waals forces. Detachment of the semiconductor chip is caused by shear forces, by a lateral movement of the adhesive stamp after the semiconductor chips have been placed on the target carrier, or by stronger forces due to an adhesive on which the semiconductor chip is placed and which bonds it to the target carrier. However, the transfer process during pickup is determined only by adhesion forces and thus has the disadvantage that adhesion on the adhesive stamp cannot be selectively turned on and off during the transfer process. Furthermore, a repair mechanism for missing or defective semiconductor chips is costly because a second stamp with a single stamp body, also known as a single pad, must serially replenish all unsuccessfully transferred positions resulting from a defective transfer or defective semiconductor chips.

SUMMARY

Embodiments provide an improved adhesive stamp and a suitable transfer method for a repair mechanism.

The adhesive stamp for transferring semiconductor chips comprises a plurality of variable-length stamp bodies arranged in an array, each stamp body having an adhesive surface for a semiconductor chip on a head portion of the stamp body.

The adhesive stamp enables simultaneous pickup and placement of a plurality of semiconductor chips arranged in a predetermined pattern corresponding to the array. The array corresponds in such a way that, in the predetermined pattern, each position is associated with a stamp body which is suitable for picking up or setting down a semiconductor chip at that position in its extended state. Furthermore, it is possible to transfer only some of the semiconductor chips in the pattern in order to fill in missing semiconductor chips in the pattern and/or to remove defective semiconductor chips from the pattern.

The stamp body can be pedestal-shaped with the adhesive surface on the head portion. The head portion faces the semiconductor chips during transfer. A foot portion faces away from the semiconductor chips during transfer. The adhesive surface is suitable for picking up a semiconductor chip, holding it during its transfer, and then setting it down. It can be designed as a round or rectangular, advantageously flat surface. Its dimension corresponds to that of the semiconductor chip or is larger. Its diameter or edge length can be in the range of 3 to 300 micrometers.

According to at least one embodiment, a first electrode is arranged in the head portion of the adhesive stamp, to which electrode a charge can be applied whose polarity can be changed. The electrode in the area of the adhesive surface allows the direct adhesive force to be switched on and off by means of electrostatics and thus to pick up, hold and set down again an advantageously precharged semiconductor chip.

According to at least one embodiment, a second electrode is additionally arranged in a foot portion of the stamp body, to which electrode a charge can be applied whose polarity can be changed. The length of the stamp body between head and foot can be varied depending on the charges applied to the first and second electrodes. The length variation allows the stamp body to be retracted in a targeted and location-specific manner so that its adhesive surface is set back in the direction of the foot portion compared to a state in which no charges are applied. In this way, any stamp body can be selectively retracted in the array. In this way, any pattern of defective semiconductor chips can be corrected, i.e. removed and replaced, by means of a transfer step, since only the stamp bodies that have not been retracted transfer semiconductor chips.

In one embodiment, the adhesive surface can be moved from a rest position to a position closer to the foot portion when charges of different polarities are applied to the first and second electrodes. When the different charges are applied to the first and second electrodes, they attract each other and cause the stamp body to shorten. When no charges are applied, the adhesive surface returns to its rest position. The same can be the case when equal charges are applied.

In one embodiment, the adhesive surface can be moved from a rest position to a position farther from the foot portion when charges of the same polarity are applied to the first and second electrodes. When the same charges are applied to the first and second electrodes, they repel each other and cause the stamp body to elongate. When no charges are applied, the adhesive surface returns to its rest position.

The length variation can be achieved by forming the stamp body from an elastic material that can be stretched and/or shortened from a predetermined shape in the rest position by the charge forces. The elastic material is located between the first and second electrodes. Without the application of force, it returns to its predetermined shape. Alternatively, it is also conceivable to have a stamp body with several elements which can be recessed into one another or displaced relative to one another.

In one embodiment, the stamp body comprises an electrically insulating material, and the first and second electrodes are electrically insulated from each other so that charge flow between the electrodes is prevented. The first electrode may be arranged as an electrically conductive layer on a surface of the head portion, and the second electrode may be arranged as an electrically conductive layer on a surface of the foot portion. Alternatively or additionally, the first electrode and/or the second electrode may be arranged as an electrically conductive layer inside the head portion and the foot portion, respectively. Such an embodiment can be formed, for example, by casting the electrodes with the insulating material.

For example, the stamp body comprises a polymer or is formed from a polymer. Preferably, the stamp body comprises an elastomer or is formed from an elastomer. Particularly preferably, the stamp body comprises a silicone or is formed from a silicone. For example, the stamp body comprises polydimethylsiloxane (PDMS) or is formed from PDMS. PDMS is generally transparent, chemically inert, and exhibits high elasticity. The stamp body may comprise a transparent, electrically insulating material or is formed from a transparent, electrically insulating material. The term "transparent" means in the present context that an element designated in this way is transparent for at least 80%, preferably for at least 85% and particularly preferably for at least 90% of irradiated electromagnetic radiation of a certain wavelength range. Particularly preferably, the stamp body is transparent to visible light. Such a transparent stamp body allows visual adjustment of the adhesive stamp through the stamp body even from the side facing away from the adhesive surfaces.

In one embodiment, the stamp body comprises a MEMS component, advantageously a MEMS actuator. "MEMS" is the abbreviation of the English term "microelectromechanical system," briefly also referred to as microsystem. It can comprise one or more sensors or actuators and control electronics on a substrate. In this embodiment, the length variation of the stamp body is accomplished by the MEMS component, advantageously an extendable MEMS actuator, as an alternative to electrostatic retraction of the adhesive surface.

The described embodiments of the adhesive stamp can be used in a method for transferring missing semiconductor chips of semiconductor chips to be arranged in a predetermined pattern on a carrier. The method comprises picking up and placing the missing semiconductor chips on the carrier by means of an adhesive stamp comprising a plurality of variable-length stamp bodies arranged in an array corresponding to the predetermined pattern and having adhesive surfaces, wherein the adhesive surfaces which do not pick up semiconductor chips are in a recessed position relative to the adhesive surfaces which pick up the missing semiconductor chips.

This method is a transfer step in a repair mode, which is performed after a preceding transfer step that can be called an assembly transfer. In the assembly transfer, the plurality of semiconductor chips is to be transferred in the predetermined pattern. The adhesive surfaces of the plurality of stamp bodies are arranged in a plane to pick up a plurality of semiconductor chips simultaneously and then to set them down simultaneously. The transfer step in the repair mode completes missing semiconductor chips in the predetermined pattern. This enables missing positions in the predetermined pattern of semiconductor chips on the target carrier to be filled with semiconductor chips simultaneously.

By selectively retracting the stamp bodies corresponding to an occupied position in the predetermined pattern, only stamp bodies corresponding to a free position pick up a still missing semiconductor chip. The position of the adhesive surfaces which pick up the missing semiconductor chips corresponds in the array with the position of the missing semiconductor chips in the given pattern. In contrast to conventional correction, where the missing semiconductor chips are added serially, the described method allows the transfer of several missing chips simultaneously and is therefore more time and cost efficient.

The method can also be used after detecting defective semiconductor chips in the predetermined pattern and picking them up and removing them using an adhesive stamp. The adhesive surfaces which do not pick up semiconductor chips are in a recessed position relative to the adhesive surfaces which pick up the defective semiconductor chips. This allows only the semiconductor chips previously detected as defective in the pattern to be picked up. The position of the adhesive surfaces which pick up the defective semiconductor chips corresponds in the array to the position of the defective chips in the predetermined pattern. By targeted control of the individual stamp bodies, any defective areas can be selectively corrected in a parallel transfer step in the repair mode, reducing overall costs.

The removal and replacement of defective semiconductor chips described above is also preceded by the assembly transfer. Errors occurring during this process are corrected by the steps described above.

In these repair steps, the stamp bodies of the adhesive surfaces that are not to pick up semiconductor chips are retracted by applying charges of different polarities to the first and second electrodes of the stamp bodies. Advantageously, during the pickup step, charges of the same polarity are applied to the first and second electrodes of the stamp bodies that are to pick up semiconductor chips, so that on the one hand these stamp bodies have an extended position and on the other hand adhesion is supported by the charge.

In the pickup step by means of an adhesive stamp having first and second electrodes on the stamp bodies, the semiconductor chip is picked up by the adhesive surface, and in the placement step the semiconductor chip is placed on a carrier. In the pickup step, a charge is applied to the first electrode whose polarity differs from the charge applied to the first electrode in the placement step. This causes a specific repulsion of the semiconductor chip when it is placed on the target carrier. In the pickup step, the semiconductor chip may be charged, for example by light incidence, in such a way that it has a polarity opposite to that of the first electrode. The charge-adjustable adhesion enables better control of the pick and place method. The control of adhesion by electrostatics described above increases the process window for the pick and place transfer.

BRIEF DESCRIPTION OF THE DRAWINGS

In the following, the adhesive stamp and the transfer method are explained in more detail with reference to exemplary embodiments and their associated figures.

FIG. 1 schematically shows an exemplary embodiment of an adhesive stamp;

FIG. 2 schematically shows a transfer of a semiconductor chip from a source carrier to a target carrier;

FIG. 3 shows a top view of a predetermined pattern of semiconductor chips on the target carrier;

FIG. 4 shows the adhesive stamp described in FIG. 1 in a repair mode;

FIG. 5 shows an alternative embodiment of an adhesive stamp in the repair mode; and FIG. 6 shows a schematic representation of a further exemplary embodiment of an adhesive stamp.

DETAILED DESCRIPTION OF ILLUSTRATIVE EMBODIMENTS

FIG. 1 schematically shows an exemplary embodiment of an adhesive stamp 30. The adhesive stamp 30 comprises a plurality of stamp bodies 32. Each stamp body 32 has a head portion 39 and a foot portion 38. The interconnected foot portions 39 of the stamp bodies 32 form a stamp plate 36. At the outer end of the head portion 39 of each stamp body 32 there is an adhesive surface 34. The adhesive surface 34 is used to pick up a semiconductor chip 40 (not shown in FIG. 1) to be transferred. It holds the semiconductor chip 40 until it is set down again. In a rest state, as shown in FIG. 1, the adhesive surfaces 34 are positioned in a plane parallel to the stamp plate 36.

The portions of the stamp bodies 32 extending from the stamp plate 36 to the adhesive surface 34 are pedestal-shaped, for example rectangular or circular in cross-section, and may taper toward the adhesive surface 34. In this exemplary embodiment, the cross-section tapers in a step-like manner. Alternatively, a continuous taper or a cylindrical shape is conceivable.

At least the portions of the stamp bodies 32 extending from the stamp plate 36 to the adhesive surface 34 are formed of an insulating elastic material that is deformable such that the length of the stamp body 32 between the head and the foot is variable, for example by compression or stretching. The stamp body 32 may comprise PDMS as an elastic insulating material. In one exemplary embodiment, the stamp body 32 is hollow on the inside to facilitate length reduction upon deformation.

A first electrode 10 is arranged in the head portion 39 of the stamp body 32, advantageously adjacent to the adhesive surface 34. A second electrode 20 is arranged in the foot portion 38 of the stamp body 32. In this exemplary embodiment, it is arranged on the side of the stamp plate 36 facing the adhesive surfaces 34. The first and second electrodes 10, 20 may also be referred to as the lower and upper electrodes, respectively.

The first and second electrodes 10, 20 can be applied as electrically conductive areas on the outside of the stamp body 32. Alternatively, they can also be arranged at least partially inside the stamp body. In this exemplary embodiment, the first electrode 10 is applied to a stepped plateau in the head portion 39, beyond which only the adhesive surface 34 protrudes. The second electrode 20 is arranged in the foot portion 38 between the stamp plate 36 and the region of the stamp body 32 projecting therefrom. By suitable control, electrical charge can be selectively applied to the first and second electrodes 10, 20 of each stamp body 30. Both the amount of charge and its polarity can be varied. It is possible to apply charge to only one of the electrodes 10, 20 or to both. In the latter case, the charge may have the same polarity or different polarities, which causes a repulsive or attractive force, respectively, between the first and second electrodes 10, 20.

The plurality of stamp bodies 32 are arranged in an array. The array corresponds to a pattern in which the semiconductor chips 40 are to be placed on a target carrier. Each position in the predetermined pattern corresponds to the position of an adhesive surface 34 in the array of the adhesive stamp 30. In one exemplary embodiment, the array includes as many stamp bodies 32 as there are positions in the pattern. In an alternative exemplary embodiment, the array includes more stamp bodies 32 than there are positions in the pattern. In one exemplary embodiment, the stamp bodies 32 in the array are arranged in rows and columns in a grid pattern.

The plurality of stamp bodies in the array may be integrally formed such that both the stamp plate 36 and the protruding stamp body portions are molded as a one-piece plastic member on or in which the electrodes 10, 20 are arranged. Alternatively, protruding stamp body portions made of an elastic material may be applied to a stamp plate 36 made of a rigid material, for example glass. The latter embodiment enables, for example, the simple production of an adhesive stamp 30 by applying the second electrodes 20 to the stamp plate 36 and then applying the protruding stamp body portions of elastic material to the second electrodes 20.

FIG. 2 schematically illustrates a transfer of a semiconductor chip 40 from a source carrier 50 to a target carrier 60 by means of the adhesive stamp 30 shown in FIG. 1. Only one stamp body 32 of the adhesive stamp 30 is shown.

In this exemplary embodiment, the semiconductor chip 40 is a small type LED, which is also referred to as a "μLED". The semiconductor chip 40 may be unpackaged, which is also referred to as a "die". The semiconductor chip 40 is positioned on the source carrier 50 prior to pickup, as shown in the left partial image. The semiconductor chip 40 may merely rest on the source carrier 50 in one exemplary embodiment, or may be connected to the source carrier 50 in an alternative exemplary embodiment. This can be done, for example, via thin bridges that break during the pickup process due to the movement of the semiconductor chip 40.

During the pickup process, the adhesive surface 34 is positioned over the semiconductor chip 40. The first electrode 10 is charged. In this exemplary embodiment, it is negatively charged. This is illustrated by the "−" signs. The semiconductor chip 40 is charged with charge of opposite polarity. This may have occurred, for example, as a result of light irradiation. In this exemplary embodiment, the semiconductor chip 40 is positively charged. This is illustrated by the "+" signs. When the semiconductor chip 40 is picked up, the adhesive surface 34 comes into contact with the semiconductor chip 40. Due to the difference in charge, the adhesion between the semiconductor chip 40 and the adhesive surface 34 is enhanced so that it can be picked up and moved away from the source carrier 50 and toward the target carrier 60 by a movement of the adhesive stamp 30, as indicated by the arrow.

The pickup step described above for a stamp body 32 and a semiconductor chip 40 is performed simultaneously for a plurality of chips on the source carrier 50, which are picked up and moved by the stamp bodies 32 of the adhesive stamp 30.

After the adhesive stamp 30 moves to the target carrier 60, the semiconductor chip 40 is set down at a predetermined position on the target carrier 60, as shown in the right partial image of FIG. 2. To detach the semiconductor chip 40, the polarity of the charge in the first electrode 10 is changed, so that positive charges are now present in this exemplary embodiment. This results in the repulsive force between the semiconductor chip 40 and the first electrode 10, which allows for secure detachment of the semiconductor chip 40 and the adhesive surface 34 when the adhesive stamp 30 with the stamp body 32 is moved away from the semiconductor chip 40.

The transfer process with a pickup and placement step is also referred to as "pick and place".

The pickup and placement step described above for a stamp body 32 and a semiconductor chip 40 is performed simultaneously for a plurality of chips on the target carrier 60. This enables a plurality of semiconductor chips 40 to be transferred and placed in a predetermined pattern on the target carrier 60. In this assembly transfer, the adhesive surfaces 34 of the plurality of stamp bodies 32 of the adhesive stamp 30 are arranged in a plane to pick up a plurality of semiconductor chips 40 simultaneously and then set them down simultaneously.

When the target carrier 60 is assembled with the plurality of semiconductor chips 40, the first step is to simultaneously transfer the plurality of semiconductor chips 40 and place them in the predetermined pattern on the target carrier 50. Although the above-described method increases control over pickup and release of the semiconductor chip 40 at its desired position due to charge-dependent adjustable adhesion, semiconductor chips 40 may be missing from the predetermined pattern on the target carrier 60. This may be because they have not been picked up, or because they have become detached during movement of the adhesive stamp 30 from the source carrier 50 to the target carrier 60, or because they have not been released from the adhesive stamp 30 on the target carrier 60. Another problem is the successful transfer of semiconductor chips 45 which prove to be defective in a subsequent inspection and detection step, however. In the former case, the missing semiconductor chips 40 are to be added to the pattern. In the latter case, the defective semiconductor chips 45 are to be removed and replaced with defect-free ones.

FIG. 3 shows in plan view a predetermined pattern of semiconductor chips on the target carrier 60. However, after the transfer of the plurality of semiconductor chips 40, not all positions are occupied by defect-free semiconductor chips 40. In some of the positions, hereinafter referred to as "fault positions", either the semiconductor chip is missing or defective. Defective semiconductor chips 45 and missing semiconductor chips 44 are corrected in the repair mode. Some of the defective semiconductor chips 45 may be converted to an operable state by laser trimming, that is, laser-beam-induced material changes, so that replacement is not required.

For selective replacement of defective semiconductor chips 45, it is necessary to detect them first. The same applies to missing semiconductor chips 44, so that the pattern recognition for missing and/or defective semiconductor chips provides an input variable for a repair mode. This can be done, for example, by means of a laser-based method, the result of which is the detection of a fault pattern with the positions of the missing or defective semiconductor chips 44, 45 within the predetermined pattern. In the repair mode, defect-free semiconductor chips 40 are placed on this fault position.

If defective semiconductor chips 45 are still positioned on the fault positions, it is necessary to selectively remove them without changing the positioning of the other semiconductor chips 40. This is done with the adhesive stamp 30, which is suitable for simultaneously picking up only the semiconductor chips 45 from the fault positions and moving them away from the target carrier 60. It should be noted that it is not necessary that the fault positions be occupied by defective semiconductor chips 45. In the case of a missing semiconductor chip 44, no pickup is then performed at this step, which does not affect the objective of no longer having a semiconductor chip positioned at any of the fault positions. Nevertheless, it is of course also conceivable that the adhesive stamp 30 is suitable for simultaneously picking up only semiconductor chips 44 from the fault positions on which defective chips have been detected. It cannot pick up semiconductor chips 40 from other positions, regardless of whether there is a semiconductor chip there or not.

FIG. 4 shows the adhesive stamp 30 described in FIG. 1 in repair mode, so that it is suitable for the steps described above for removing defective semiconductor chips 45 or transferring missing semiconductor chips 44.

In the repair mode of the adhesive stamp 30, the stamp bodies 32 in the array are controlled such that the length of the stamp bodies 32 corresponding to the fault positions is greater than the length of the other stamp bodies 32. The stamp bodies 32 corresponding to the fault positions enable selectively removing defective semiconductor chips 45 and replacing them with other semiconductor chips 40. The adhesive surfaces 34 of the shorter stamp bodies 32 are closer to the stamp plate 36 than the adhesive surfaces 34 of the longer stamp bodies 32, and only the latter are suitable for picking up semiconductor chips 40. Therefore, their state can also be referred to as "on position". The state of the shorter stamp bodies 32 can be referred to as the off position.

In the exemplary embodiment shown in FIG. 4, the length of the stamp bodies 32 that do not correspond to the fault positions is shortened by applying charges of different polarities to their first and second electrodes 10, 20. In this exemplary embodiment, a negative charge is applied to the first electrode 10, and a positive charge is applied to the second electrode 20. In FIG. 4, these are the outer stamp bodies 32. Due to the electrostatic force between the first and second electrodes 10, 20, the stamp body 32 is deformed and its length L2 between the first and second electrodes 10, 20 is less than the length L1 of the stamp bodies 32 corresponding to the fault positions between the first and second electrodes 10, 20, to which no charges are applied. The difference in length between the extended and retracted stamp bodies 32 may be in the range of 1%.

When positioning the adhesive stamp 30 over the pattern on the target carrier 60, only the adhesive surfaces 34 of the extended stamp bodies 32 now come into contact with the semiconductor chips 40. In this way, only the defective semiconductor chips 45 can be removed.

After removing the defective semiconductor chips 45, the adhesive stamp 30 in the repair mode can pick up semiconductor chips 40 from a source carrier 50, move them to the target carrier 60, and place them at the now vacant positions in the pattern. Only the extended stamp bodies 32 pick up and transfer semiconductor chips 40 in this step. The transfer can take place both when no charge is applied to the first electrodes 10 of the stamp bodies 32 by means of which the transfer takes place and when charge is applied, as has already been described in connection with FIGS. 1 and 2.

FIG. 5 schematically shows another exemplary embodiment of an adhesive stamp 30 in repair mode. Only the differences to the previous exemplary embodiments are described.

The adhesive stamp 30 comprises a plurality of stamp bodies 32. Each stamp body 32 has a head portion 39 and a foot portion 38. The interconnected foot portions 38 of the stamp bodies 32 form a stamp plate 36. At the outer end of the head portion 39 of each stamp body 32 there is an adhesive surface 34. In a rest state, the adhesive surfaces 34 are positioned in a plane parallel to the stamp plate 36.

The second electrode 20 of each of the stamp bodies 32 is arranged on the side of the stamp plate 36 facing away from the adhesive surfaces 34. In the portion of the stamp body 32 that projects from the stamp plate 36 to the adhesive surface 34, the first electrode 10 is arranged in its interior. In this exemplary embodiment, the first electrode 10 is closer to the stamp plate 36 than in the exemplary embodiment described in FIG. 1. The exemplary embodiment shown in FIG. 5 may, for example, be made of a carrier plate on one side of which the second electrodes 20 are applied and on the other side of which the portions projecting above the stamp plate are formed from an elastic material, in which portions the first electrodes 10 are casted.

In the repair mode of the adhesive stamp 30, the stamp bodies 32 in the array are controlled such that the length L1 between the electrodes 10, 20 of the stamp bodies 32 corresponding to the fault pattern is greater than the length L2 between the electrodes 10, 20 for the other stamp bodies. The stamp bodies 32 corresponding to the fault pattern make it possible to selectively remove defective semiconductor chips 45 and replace them with defect-free semiconductor chips 40. In the exemplary embodiment shown in FIG. 5, the length L2 between the electrodes 10, 20 of the stamp bodies 32 that do not correspond to the fault pattern is shortened by applying charges of different polarities to their first and second electrodes 10, 20. Due to the electrostatic force between the first and second electrodes 10, 20, the stamp body 32 is deformed and its length L2 between the electrodes 10, 20 is less than the length L1 between the electrodes 10, 20 of the stamp bodies 32 corresponding to the fault pattern, to whose first and second electrodes 10, 20 the same charges are applied, so that a repulsive force acts between the electrodes 10, 20, which either holds the stamp bodies 32 in their rest position or shapes them in such a way that the length L1 between the electrodes 10, 20 is increased.

Replacement of defective semiconductor chips 45 and filling of vacant positions 44 in the predetermined pattern is performed as described earlier.

FIG. 6 shows a schematic representation of another exemplary embodiment of an adhesive stamp 30 that differs from the one in FIG. 5 only in that MEMS actuators 80 are arranged in the stamp bodies 32 instead of first and second electrodes. The actuators convert electrical signals into a mechanical movement, in this case a change in length of the actuator 80. The actuators 80 are arranged in a carrier 86, on the underside of which portions of the stamp bodies 32 are arranged. A change in length of the actuator 80 is also accompanied by a change in length of the stamp body 32, since the extending actuator 80 pushes the portion of the stamp body 32 on the underside of the carrier away from the carrier 86.

The described adhesive stamps 30 allow semiconductor chips 40 to be transferred in assembly and repair mode, as described above.

The method for replacing defective semiconductor chips 45 and transferring missing semiconductor chips 44 also allows multiple semiconductor chips to be selectively transferred in parallel in the repair mode, and also has the advantage that the described adhesive stamp 30 can easily replace conventional adhesive stamps with subsequent serial correction, so that no major change in the assembly process is required.

The invention is not limited to the exemplary embodiments by the description based on the same. Rather, the invention encompasses any new feature as well as any combination of features, which in particular includes any combination of features in the patent claims, even if this feature or combination itself is not explicitly specified in the patent claims or embodiments.

The invention claimed is:

1. An adhesive stamp comprising:
    a plurality of variable-length stamp bodies arranged in an array,
    wherein each stamp body has an adhesive surface on a head portion of the stamp body, the adhesive surface configured to hold a semiconductor chip,
    wherein a first electrode is arranged in the head portion,
    wherein the first electrode is chargeable and whose polarity is changeable,
    wherein a second electrode is arranged in a foot portion of the stamp body,
    wherein the second electrode is chargeable and whose polarity is changeable,
    wherein a length of the stamp body is variable depending on charges applied to the first electrode and the second electrode, and
    wherein the adhesive stamp is configured to transfer semiconductor chips.

2. The adhesive stamp according to claim 1, wherein the adhesive surface is movable from a rest position to a position closer to the foot portion when charges of different polarities are applied to the first electrode and the second electrode.

3. The adhesive stamp according to claim 1, wherein the adhesive surface is movable from a rest position to a position farther from the foot portion when charges of the same polarity are applied to the first electrode and the second electrode.

4. The adhesive stamp according to claim 1, wherein the first electrode is arranged as an electrically conductive layer on a surface of the head portion or as a conductive layer inside the head portion, and wherein the second electrode is arranged as an electrically conductive layer on a surface of the foot portion or as a conductive layer inside the foot portion.

5. The adhesive stamp according to claim 1, wherein the stamp body comprises an elastic material.

6. The adhesive stamp according to claim 1, wherein the stamp body comprises a MEMS component.

7. A method for transferring missing semiconductor chips of semiconductor chips to be arranged in a predetermined pattern on a carrier, the method comprising:
    picking up and placing, by an adhesive stamp, the missing semiconductor chips on the carrier,
    wherein the adhesive stamp comprises a plurality of variable-length stamp bodies arranged in an array corresponding to the predetermined pattern and having adhesive surfaces, and
    wherein the adhesive surfaces that do not pick up semiconductor chips are in a recessed position relative to the adhesive surfaces that pick up the missing semiconductor chips.

8. The method according to claim 7, further comprising detecting defective semiconductor chips in the predetermined pattern and picking them up and removing them by the adhesive stamp, wherein the adhesive surfaces that do not pick up semiconductor chips are in a recessed position relative to the adhesive surfaces that pick up the defective semiconductor chips.

9. The method according to claim 7, wherein positions of the adhesive surfaces that pick up the missing semiconductor chips in the array correspond to the positions of the missing semiconductor chips in the predetermined pattern.

10. The method according to claim 7, wherein the adhesive stamp comprises a plurality of variable-length stamp bodies arranged in an array, wherein each stamp body has an adhesive surface on a head portion of the stamp body, the adhesive surface configured to hold a semiconductor chip, wherein a first electrode is arranged in the head portion, wherein the first electrode is chargeable and whose polarity is changeable, wherein a second electrode is arranged in a foot portion of the stamp body, wherein the second electrode is chargeable and whose polarity is changeable, wherein a length of the stamp body is variable depending on charges applied to the first electrode and the second electrode, and wherein the method further comprises applying charges of different polarities to the first electrode and the second electrode of the stamp bodies with the adhesive surfaces that do not pick up semiconductor chips.

11. The method according to claim 7, wherein the adhesive stamp comprises a plurality of variable-length stamp bodies arranged in an array, wherein each stamp body has an adhesive surface on a head portion of the stamp body, the adhesive surface configured to hold a semiconductor chip, wherein a first electrode is arranged in the head portion, wherein the first electrode is chargeable and whose polarity is changeable, wherein a second electrode is arranged in a foot portion of the stamp body, wherein the second electrode is chargeable and whose polarity is changeable, wherein a length of the stamp body is variable depending on charges applied to the first electrode and the second electrode, and wherein the method further comprises applying charges of the same polarity to the first electrode and the second electrode of the stamp bodies that pick up semiconductor chips.

12. The method according to claim 7, wherein the adhesive stamp comprises a plurality of variable-length stamp bodies arranged in an array, wherein each stamp body has an adhesive surface on a head portion of the stamp body, the adhesive surface configured to hold a semiconductor chip, wherein a first electrode is arranged in the head portion, wherein the first electrode is chargeable and whose polarity is changeable, wherein a second electrode is arranged in a foot portion of the stamp body, wherein the second electrode is chargeable and whose polarity is changeable, wherein a length of the stamp body is variable depending on charges applied to the first electrode and the second electrode, and wherein picking up comprises picking up a semiconductor chip by an adhesive surface and placing comprising placing the semiconductor chip on the carrier in such a way that while picking up a charge is applied to the first electrode whose polarity differs from the charge applied to the first electrode while placing.

13. The method according to claim 7, wherein the adhesive surfaces of the plurality of stamp bodies are arranged in a plane to simultaneously pick up and then simultaneously place a plurality of semiconductor chips.

* * * * *